(12) United States Patent
Papageorgiou et al.

(10) Patent No.: US 7,206,703 B1
(45) Date of Patent: Apr. 17, 2007

(54) SYSTEM AND METHOD FOR TESTING PACKAGED DEVICES USING TIME DOMAIN REFLECTOMETRY

(75) Inventors: Vassilios Papageorgiou, Austin, TX (US); Michael Zhuoying Su, Round Rock, TX (US); Amado Ramirez, Austin, TX (US); Gary A. Cousins, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/120,017

(22) Filed: May 2, 2005

(51) Int. Cl.
*G01R 31/00* (2006.01)
(52) U.S. Cl. .................................................. 702/58
(58) Field of Classification Search .............. 702/35, 702/36, 117, 118, 121, 124, 58; 324/532–535
See application file for complete search history.

(56) References Cited

U.S. PATENT DOCUMENTS

| | | | |
|---|---|---|---|
| 5,514,965 A | 5/1996 | Westwood | |
| 6,026,145 A | 2/2000 | Bauer et al. | |
| 6,137,293 A | 10/2000 | Wu et al. | |
| 6,285,195 B1 | 9/2001 | Needle | |
| 6,324,485 B1* | 11/2001 | Ellis | 702/117 |
| 6,500,699 B1* | 12/2002 | Birdsley et al. | 438/121 |
| 6,545,497 B2* | 4/2003 | Hebert et al. | 324/765 |
| 6,816,242 B2* | 11/2004 | Qian et al. | 356/73.1 |
| 6,867,613 B1* | 3/2005 | Bienek | 324/765 |
| 2002/0135357 A1* | 9/2002 | Maassen et al. | 324/158.1 |
| 2003/0208734 A1* | 11/2003 | Coelho et al. | 716/6 |
| 2005/0168233 A1* | 8/2005 | Roberts et al. | 324/763 |

* cited by examiner

*Primary Examiner*—Michael Nghiem
(74) *Attorney, Agent, or Firm*—Meyertons Hood Kivlin Kowert & Goetzel, P.C.; Rory D. Rankin (57) ABSTRACT

A test system configured to detect discontinuities in packaged devices. A test unit includes a pulse generator and a sampling circuit. The packaged device is coupled to the test unit via a test fixture. The test unit is configured to transmit a pulse to the packaged device through the test fixture, receive a reflected signal from the packaged device through the test fixture in response to the transmitted pulse, and analyze the reflected signal to detect a discontinuity within the packaged device and/or determine the location of a discontinuity within the packaged device. The test system is configured to store a calibration dataset which includes a set of sample values corresponding to a time domain reflectometry (TDR) test of a calibration packaged device. The test unit is configured to compare data corresponding to the reflected signal to stored values of the calibration dataset to detect a discontinuity in the packaged device.

15 Claims, 6 Drawing Sheets

SYSTEM AND METHOD FOR TESTING PACKAGED DEVICES USING TIME DOMAIN REFLECTOMETRY

BACKGROUND OF THE INVENTION

1. Field of the Invention

This invention relates to test apparatus and, more particularly, to testing packaged electronic devices.

2. Description of the Related Art

Time domain reflectometry (TDR) is an established technology for testing electrical cables. By transmitting a short electrical pulse into a cable and examining the electrical signatures of reflections, a test apparatus may detect the presence of open circuit and short circuit faults in the cable. In addition to detecting the presence of faults, it is possible to determine the distance along the length of the cable at which the fault is located by measuring the time interval between the transmission of a pulse and reception of a corresponding reflected pulse.

In order to measure distance via TDR, it is generally necessary to calibrate the velocity of propagation of pulses in the cable or other electrically conducting medium under test. An electrically conducting element and its corresponding return conducting path may be said to form a transmission line having a characteristic impedance. The characteristic impedance is a function of the geometry between the conducting element and its return path and the effective dielectric constant of the material separating them. An electrical pulse propagating in the transmission line will reflect, at least partially, from any point at which there is a change in the characteristic impedance. In some cases, it is possible to calculate the characteristic impedance knowing the geometry of the transmission line and the type of material separating the signal and return paths. In other cases, it is possible to measure the velocity of propagation by measuring the length of a known, defect-free sample of the transmission line to be tested and the time between the transmission of a pulse and a reflection from the end of the transmission line.

In order to accommodate a variety of cable lengths, materials, and geometries, it is often necessary to adjust the characteristics of electrical pulses transmitted into a transmission line. A longer-width pulse may inject more energy into the transmission line, propagate further, and produce a stronger reflection than a shorter-width pulse. A higher amplitude pulse may also produce a stronger return signal, improving the signal-to-noise ratio of the measurement. The faster the rise-time, the finer the resolution obtainable. Accordingly, adjustments are typically made to the pulse width and amplitude in order to obtain a suitably strong signal from a transmission line under test. In addition, the resolution with which a length of transmission line may be measured is typically dependent upon the rise-time of the pulse transmitted into the transmission line under test. Consequently, it may be desirable to use as fast a rise time as is economically practical for the desired measurement.

A TDR measurement typically requires test equipment such as a wide-bandwidth sampling oscilloscope capable of injecting a pulse into the device under test. Commercially available TDR equipment generally comprises a wide-bandwidth oscilloscope coupled to specialized add-on TDR modules and analysis software tools, available from numerous vendors. For example, general purpose wide-bandwidth oscilloscopes such as the Agilent® 86100B equipped with a 54754A TDR pulse generator module and N1930A physical layer test system software or the Tektronix® 8000 Series oscilloscope with a TDR-equipped 80E04 electrical sampling module may be employed to perform TDR measurements. Also, automatic test equipment (ATE) such as the Teradyne® Integra J750 test platform with the Femto® 2000 Time Interval Analyzer installed is capable of performing TDR measurements. Other vendors, such as Picosecond Pulse Labs® offer components that, with applicable hardware and software options, may be used to perform TDR measurements.

SUMMARY OF THE INVENTION

Various embodiments of a test system including a test unit coupled to a test fixture and a packaged device coupled to the test fixture are disclosed. In one embodiment, a test unit includes a pulse generator and a sampling circuit. The packaged device is coupled to the test fixture through a plurality of electrical pins. The test unit is configured to transmit a pulse to at least one of the plurality of electrical pins through the test fixture, receive a reflected signal from the packaged device through the test fixture in response to the transmitted pulse, and analyze the reflected signal to detect a discontinuity in the packaged device. In some embodiments, the test fixture includes a device interface board having a plurality of sockets, each of which is coupled to a respective one of the plurality of electrical pins.

In a further embodiment, the pulse generator and the sampling circuit are coupled to the test fixture through a selector. The selector is configured to couple the pulse generator and the sampling circuit to a selected one of the plurality of sockets in response to a command from a processor.

In a still further embodiment, the test system is configured to store a calibration dataset comprising a set of sample values corresponding to a time domain reflectometry (TDR) test of a calibration packaged device. The test unit is configured to compare data corresponding to the reflected signal to stored values of the calibration dataset to detect a discontinuity in the packaged device. The calibration packaged device may be a packaged device which contains no discontinuities, or a packaged device which contains a discontinuity at a known location. The known location within the device may be (a) a known location within the semiconductor die, (b) at a coupling between one or more of the first plurality of electrical contacts and the second plurality of electrical contacts, or (c) at a coupling between one or more of the plurality of electrical pins and the test fixture.

While the invention is susceptible to various modifications and alternative forms, specific embodiments are shown by way of example in the drawings and are herein described in detail. It should be understood, however, that drawings and detailed descriptions thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

Figure 1:
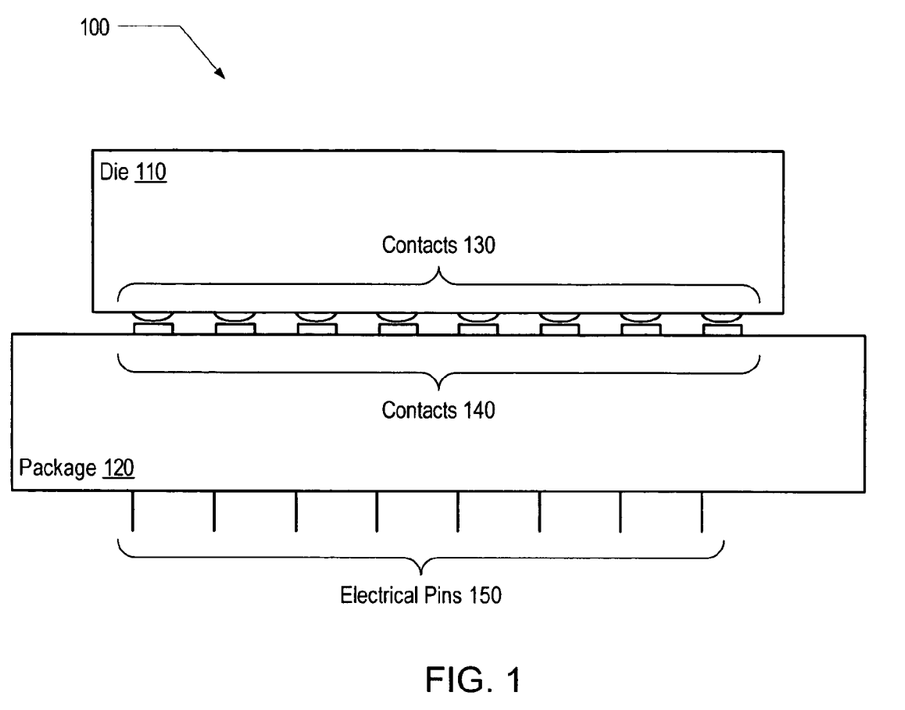
FIG. 1 illustrates one embodiment of the components of a packaged device.

FIG. 1 illustrates one embodiment of the components of a packaged device 100. Packaged device 100 is illustrative of a variety of semiconductor integrated circuit packages that include a semiconductor die with a high-density of circuitry and electrical contacts for interfacing the circuitry to a host electronic device. For example, packaged device 100 may be a microprocessor, a memory device, a logic array, an imaging array, a digital signal processor, or any of a variety of other integrated circuit devices. As shown, packaged device 100 includes a die 110 on which are fabricated an array of contacts 130. Contacts 130 may be coupled to a corresponding array of contacts 140 fabricated on a package 120. Package 120 may also include an array of electrical pins 150 through which packaged device 100 may be connected to other electronic devices.

In one embodiment, die 110 comprises a semiconductor material such as silicon, but may comprise any other suitable material, such as germanium, gallium arsenide, indium antimonide, etc. During fabrication, a sequence of process steps may be employed to produce multiple layers of interconnected circuitry within a semiconductor substrate from which die 110 may be cut. For example a single-crystal substrate of a semiconductor material may undergo process steps including photolithography, doping, oxidation, deposition, etching, and epitaxial growth in order to produce circuit features within the substrate. Photolithography may include coating the substrate with a light-sensitive material and exposing the coating to light energy in the shape of a desired pattern. Doping, i.e., adding impurities into specific regions of the substrate, may be achieved by techniques such as diffusion or implantation. Oxidation may be employed to grow an insulating layer on the substrate. Deposition of various materials, having semiconducting, insulating, or conducting properties, onto the substrate may produce additional features and or connections between features in the substrate. Etching may be used to remove material from the surface of the substrate in a pattern determined by a mask layer such as would be produced by photolithography. Epitaxial growth describes a process by which a single-crystal layer of semiconductor material may be created on the surface of the substrate. Through various combinations of the preceding, as well as other or alternative steps, very high densities of electronic circuitry may be fabricated into a given substrate.

In one embodiment, die 110 is coupled to package 120 through a pair of arrays of contacts 130 and 140 of appropriate size and pitch. Contacts 130, in one embodiment, may be produced on the surface of die 110 during the fabrication process or, in other embodiments, after die 110 is cut from a semiconductor substrate. In the illustrated embodiment, packaged device 100 may be produced by a direct chip attach assembly technique (DCA), also sometimes referred to as "flip chip". For example, contacts 130 may be produced on die 110 by sputtering, plating, or otherwise depositing a layer of conductive material such as solder onto an underlying layer of bond pads within the semiconductor substrate. Alternatively, die 110 may be attached to package 120 through wire bonding, in which a number of wires may be bonded to the opposite side of die 110 and curled over to contact pads on the surface of package 120 in an area around the periphery of die 110. Contacts 130 may be referred to as "bumps". In one embodiment, contacts 130 may be created by a process of controlled collapse chip connection (C4) through which the separation between the surface of die 110 and package 120 may be controlled. Numerous such alternatives are possible and are contemplated.

Within package 120, electrical pins 150 may be connected to contacts 140. In various embodiments, depending on the design of packaged device 100 and the desired location of electrical pins 150 to accommodate connection to other electronic devices, package 120 may contain circuit traces to route any one of pins 150 to any selected one or more of contacts 140. As shown, the number of pins 150 may be equal to the number of contacts 140. In other embodiments, the number of pins 150 may be greater or less than the number of contacts 140.

During the fabrication and assembly of packaged device 100, discontinuities within the desired electrical connection paths between pins 150 and the circuitry within die 110 may be introduced. Accordingly, an efficient method for detecting the presence and location of such discontinuities may be desired. By analyzing the occurrences of discontinuities at various locations within a sample of packaged devices, significant cost-saving and or yield-enhancing improvements to production processes may be suggested and/or verified.

Figure 2:
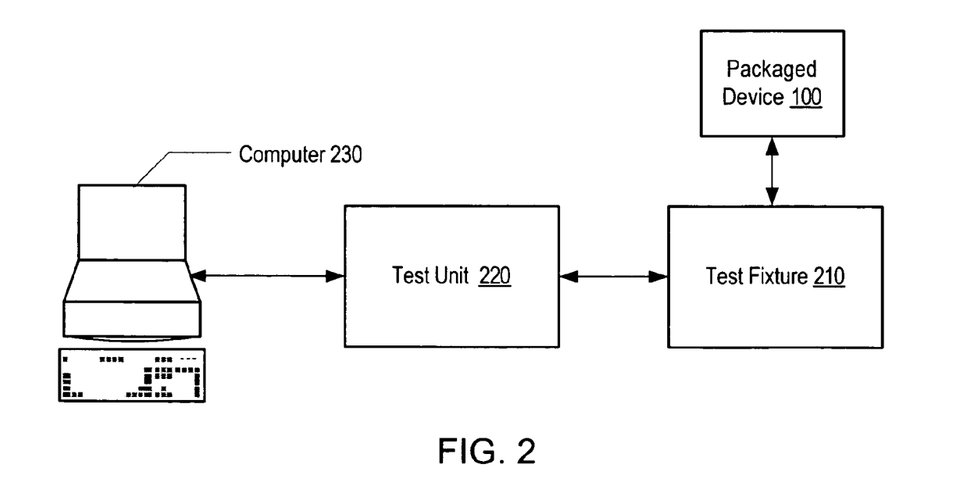
FIG. 2 illustrates a generalized block diagram of a test system used to detect discontinuities in a packaged device.

FIG. 2 illustrates a generalized block diagram of a test system used to detect discontinuities in a packaged device. In the illustrated embodiment, packaged device 100 may be coupled to a test fixture 210, test fixture 210 may be coupled to a test unit 220, and test unit 220 may be coupled to and controlled by a computer 230. For purposes of illustration, a single packaged device is shown coupled to test fixture 210. In other embodiments, several packaged devices may be coupled to a single test fixture 210 and tested either sequentially or in parallel. Computer 230 may be a personal computer (PC), workstation, or any suitable computing device that may provide a user interface to the test system, execute test programs for controlling test unit 220, and analyze signals returned from test unit 220. Detailed descriptions of embodiments of test fixture 210, test unit 220, and computer 230 are presented below.

Figure 3:
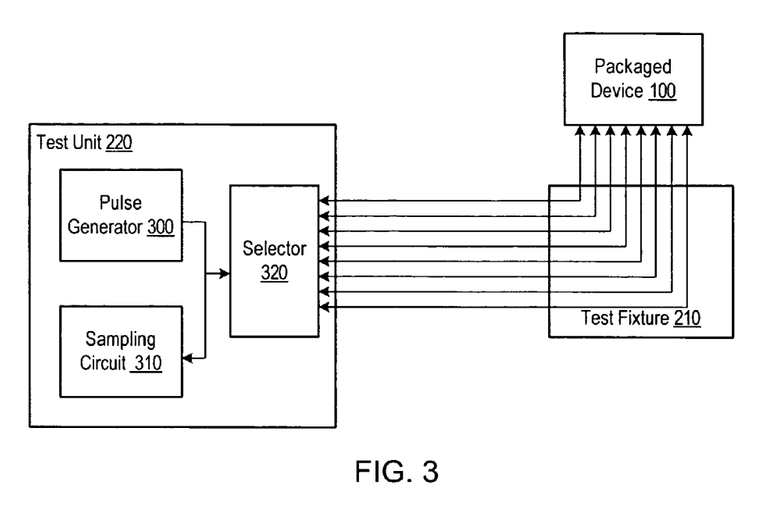
FIG. 3 is a block diagram of a test subsystem including a test unit and a test fixture for holding a packaged device under test.

FIG. 3 is a block diagram of one embodiment of a test subsystem including test unit 220 and test fixture 210 for holding a packaged device under test. In one embodiment, test unit 220 includes a pulse generator 300 and a sampling circuit 310 coupled to a selector 320. Selector 320 is shown coupled to packaged device 100 through multiple connections that pass through test fixture 210.

In one embodiment, selector 320 may comprise a single-pole, multi-throw switch. In operation, pulse generator 300 and sampling circuit 310 may be connected to the single pole of selector 320. Selector 320 may, in response to a configuration setting, manual switch setting, or software command, connect pulse generator 300 and sampling circuit 310 to a selected one of the pins of packaged device 100. In other embodiments, selector 320 may be a multiplexer/de-multiplexer with a single connection point for both pulse generator 300 and sampling circuit 310 or separate connections for each of pulse generator 300 and sampling circuit 310. In further embodiments, selector 320 may connect more than one pulse generator and sampling circuit to more than one of the pins of packaged device 100.

During a test for discontinuities in packaged device 110, pulse generator 300 and sampling circuit 310 may be configured to perform time domain reflectometry (TDR) measurements. In general, pulse generator 300 may transmit a pulse into a selected connection through, for example, selector 320, while sampling circuit 310 may receive a reflected pulse from the same connection. Discontinuities in the selected connection may be detected by analyzing the reflected signal. A more complete description of TDR measurements of a packaged device is presented below.

Figure 4:
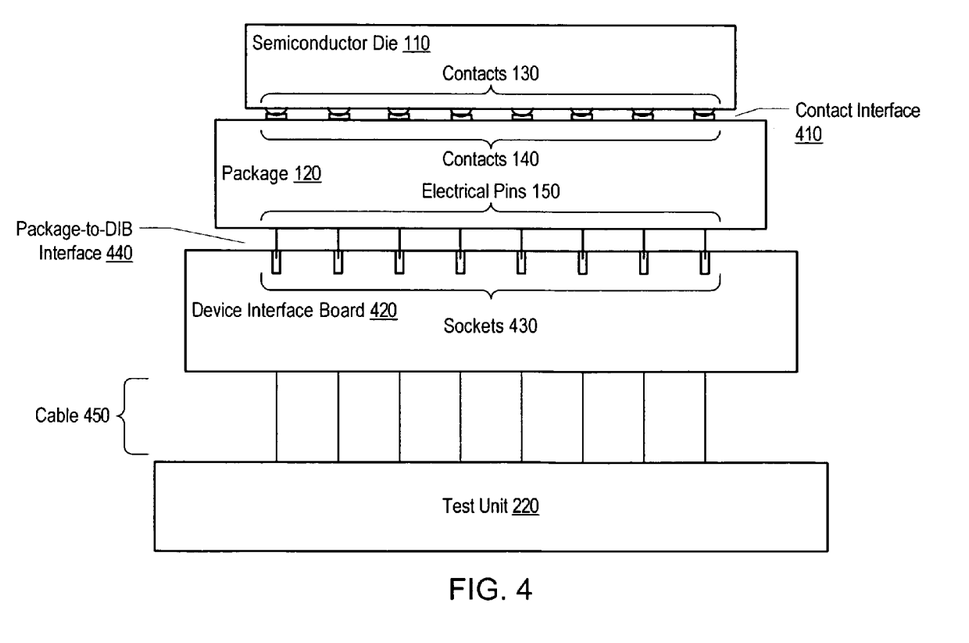
FIG. 4 illustrates one embodiment of the connections within a packaged device and between a packaged device and a test unit.

FIG. 4 illustrates one embodiment of the connections within packaged device 100 and between packaged device 100 and test unit 220. Test unit 220 may be coupled to a device interface board (DIB) 420 that functions as a test fixture for packaged device 100. As shown, the interface between contacts 130 and 140 may be referred to as contact interface 410. In the illustrated embodiment, DIB 420 includes an array of sockets 430 arranged to accommodate the size and pitch of electrical pins 150. As shown, the interface between pins 150 and sockets 430 may be referred to as package-to-DIB interface 440. DIB 420 may be coupled to test unit 220 via a multi-conductor cable or other suitable connecting device 450. In some embodiments, DIB 420 may include one or more arrays of sockets 430 to accommodate testing one or more packaged devices. In these and other embodiments, the switching and multiplexing functionality previously described in connection with selector 320 may be incorporated into DIB 420.

Figure 5:
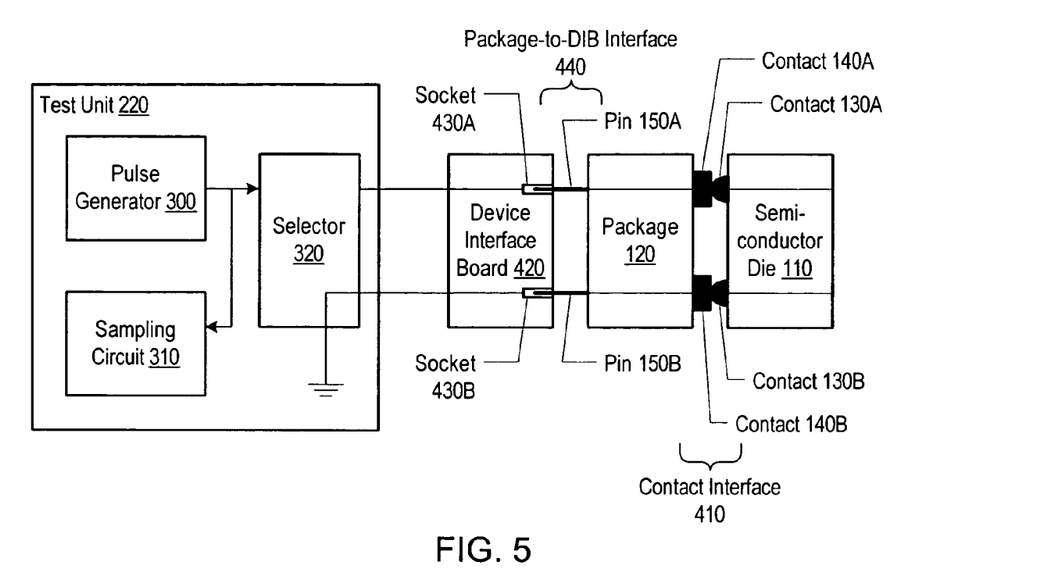
FIG. 5 illustrates a representative signal path involved in one embodiment of a TDR test of a packaged device.

FIG. 5 illustrates a representative signal path involved in one embodiment of a TDR test of packaged device 100. For purposes of illustration only, two connection paths are shown between selector 320 and die 110. Typically, many more than two connections may exist between selector 320 and die 110. As shown, a signal path (hereinafter referred to as "signal path A") may comprise a connection between selector 320, socket 430A of DIB 420, pin 150A of package 120, contact 140A of package 120, contact 130A of die 110, and a circuit path within die 110. Correspondingly, a return path (hereinafter referred to as "signal path B") may comprise a connection between a circuit path within die 110, contact 130B of die 110, contact 140B of package 120, pin 150B of package 120, socket 430B of DIB 420, and a ground connection within selector 320.

In operation of the illustrated embodiment, pulse generator 300 may transmit a signal pulse through selector 320 to signal path A with a return path comprising signal path B. It is noted that in some embodiments, signal path B may comprise more than one of any of contacts 130, contacts 140, electrical pins 150, sockets 430, and wires within cable 450 in order to provide a low-noise, low-impedance ground connection. To simplify the ensuing discussion, it will be assumed that there are no discontinuities in signal path B. Consequently, all measurements may be interpreted as being measurements of signal path A.

Sampling circuit 310 may also be connected to signal path A and may be configured to capture a test dataset that corresponds to a reflected signal generated by any discontinuities in signal path A. Sampling circuit 310 may capture one or more calibration datasets from signal path A if signal path A is known to contain an open or short circuit at one or more specific locations between selector 320 and the termination point of the circuit within die 110. For example, a calibration dataset may correspond to a signal including a reflection from the end point of signal path A within die 110. In that case the calibration dataset is indicative of a proper test setup with no open circuit discontinuities in signal path A. Additional calibration datasets may be obtained in which known discontinuities are introduced into signal path A at various locations such as package-to-DIB interface 440 of FIG. 4 or contact interface 410 of FIG. 4. A TDR measurement may comprise a measurement of the time between the initiation of a pulse from pulse generator 300 and the time at which a corresponding reflected signal is received in the test or calibration dataset by sampling circuit 310. By comparing a TDR measurement from a test dataset with that of a number of calibration datasets, the location of discontinuities in signal path A may be determined.

Figure 6:
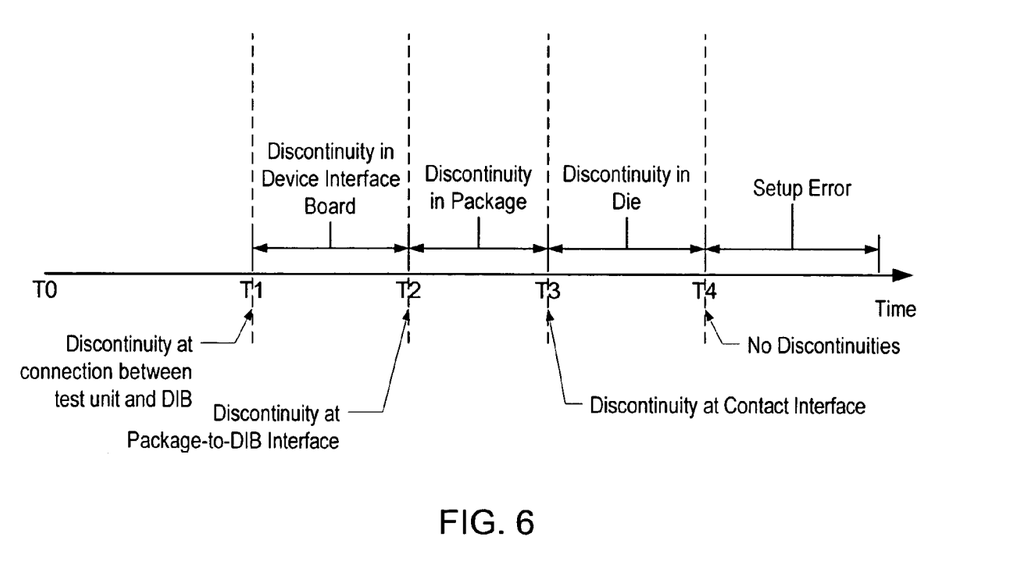
FIG. 6 illustrates the timing of reflected signals from one embodiment of a TDR test of a packaged device.

FIG. 6 illustrates the timing of reflected signals from one embodiment of a TDR test of packaged device 100. Time T1 may be determined from a calibration dataset in which a discontinuity is introduced, or otherwise known, at the connection between selector 320 and DIB 420. Time T2 may be determined from a calibration dataset in which a discontinuity is introduced or known at package-to-DIB interface 440. Time T3 may be determined from a calibration dataset in which a discontinuity is introduced or known at contact interface 410. Finally, time T4 may be determined from a calibration dataset in which no discontinuities are present in the signal path.

As will be apparent to those of ordinary skill in the art, repeated measurements of the timing of reflected calibration signals from a packaged device in which a discontinuity is introduced at a given location may yield measured values of time that cluster around an average value with a small variation or "delta". For purposes of discussion, references to the values of T1, T2, T3, and T4 indicate the average value obtained from several measurements. It is also assumed that the variations that may be obtained in a given measurement of time over several TDR measurements is small compared to the differences between each of T1, T2, T3, and T4. It is further assumed that the calibration process includes determining the value of the variation or delta for each of T1, T2, T3, and T4. For ease of illustration, these deltas are not shown in FIG. 6. In the discussions to follow, time measurements that are within a measured delta of a calibration value may be said to be equal to the calibration value. For example, if a measured time "Tm" is in the range $$T3-delta < Tm < T3+delta$$

then it may be said that Tm=T3.

During a TDR test, the time at which a reflected signal is received by sampling circuit 310 may be compared to times T1, T2, T3, and T4. Table 1 illustrates the interpretation of one embodiment of TDR time measurements.

TABLE 1

| Measured time Tm | Interpretation |
| --- | --- |
| Tm = T1 | Discontinuity at the connection between selector 320 and DIB 420 |
| T1 < Tm < T2 | Discontinuity within DIB 420 |
| Tm = T2 | Discontinuity at package-to-DIB interface 440 |
| T2 < Tm < T3 | Discontinuity within package 120 |
| Tm = T3 | Discontinuity at contact interface 410 |

TABLE 1-continued

| Measured time Tm | Interpretation |
|---|---|
| T3 < Tm < T4 | Discontinuity within die 110 |
| Tm = T4 | No discontinuities |
| T4 < Tm | Error in test setup |

Figure 7:
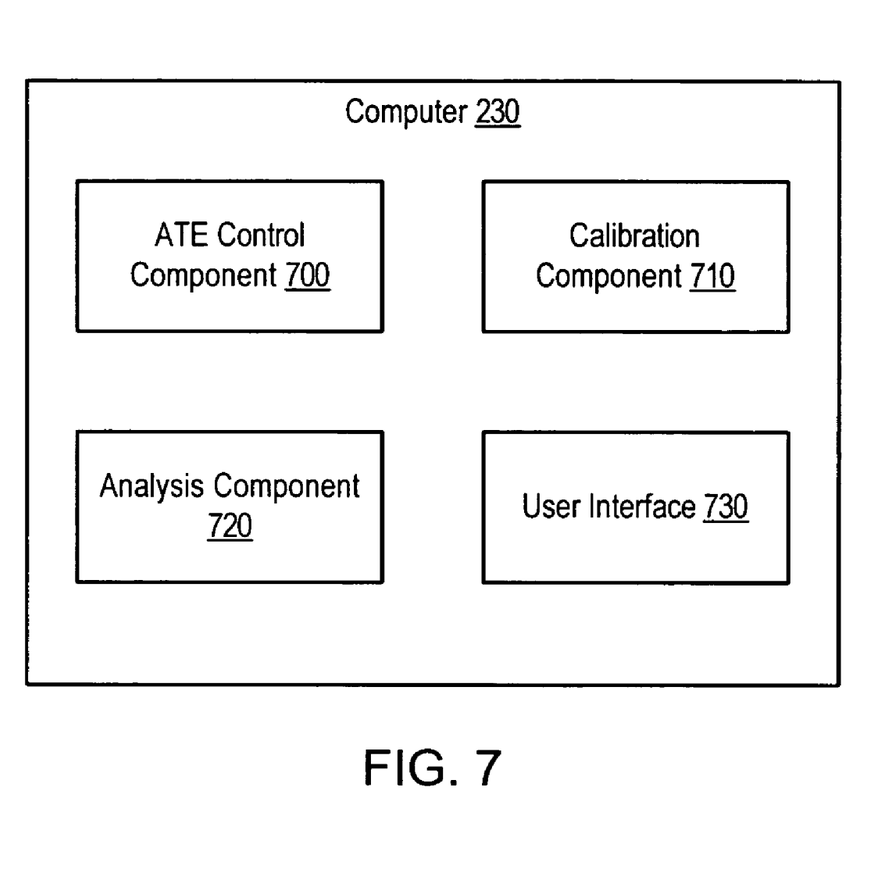
FIG. 7 illustrates one embodiment of software programs that may be executed by a computer as part of a TDR test of a packaged device.

FIG. 7 illustrates one embodiment of hardware and/or software components that may be utilized as part of a TDR test of a packaged device 100. Generally such components may be separate as shown, or may be combined in any suitable manner. In one embodiment, each of the components in FIG. 7 comprise software components which form a TDR test program that may be executed by a computer 230. In such an embodiment, software components may comprise code which is stored on a computer accessible medium such as disk, memory, or any other suitable medium. In an alternative embodiment, the software that is executed by a computer 230 may comprise a number of independent processes each performing a portion of a TDR test. Broadly speaking, the software executed by computer 230 may be grouped into four components. For example, computer 230 may be configured to execute Automated Test Equipment (ATE) control component 700 comprising instructions that control the operation of pulse generator 300, selector 320, and sampling circuit 310. Computer 230 may also execute calibration component 710 comprising instructions to calibrate TDR measurements. Computer 230 may also execute analysis component 720 comprising instructions to compare a test dataset to a calibrate dataset. In addition, computer 230 may execute instructions that provide a user interface 730 to the TDR test operator for configuring and controlling ATE control component 700, calibration component 710, and analysis component 720.

In one embodiment, user interface 730 may comprise a graphical user interface (GUI). In an alternative embodiment, user interface 730 may comprise a command line interface. The number and type of inputs and displays made available to the user by user interface 730 may depend on a variety of factors. For example, the user may be prompted to select a particular packaged device to be tested in the case in which a test fixture may hold multiple packaged devices. The user may also be prompted to insert or remove calibration packaged devices or test packaged devices. User interface 730 may also, in one embodiment, permit the user to adjust the current level of or pulse duration of the output of pulse generator 300. The above items are only a small sample of the variety of test configuration settings that may be set by a user through user interface 730. In addition, user interface 730 may present results in table of numbers, or in a graphical representation such as would be seen on the screen of an oscilloscope or as a dashboard-style display in which icons, multi-color highlighting, or other visual cues provide an indication of discontinuities that have been detected.

Figure 8:
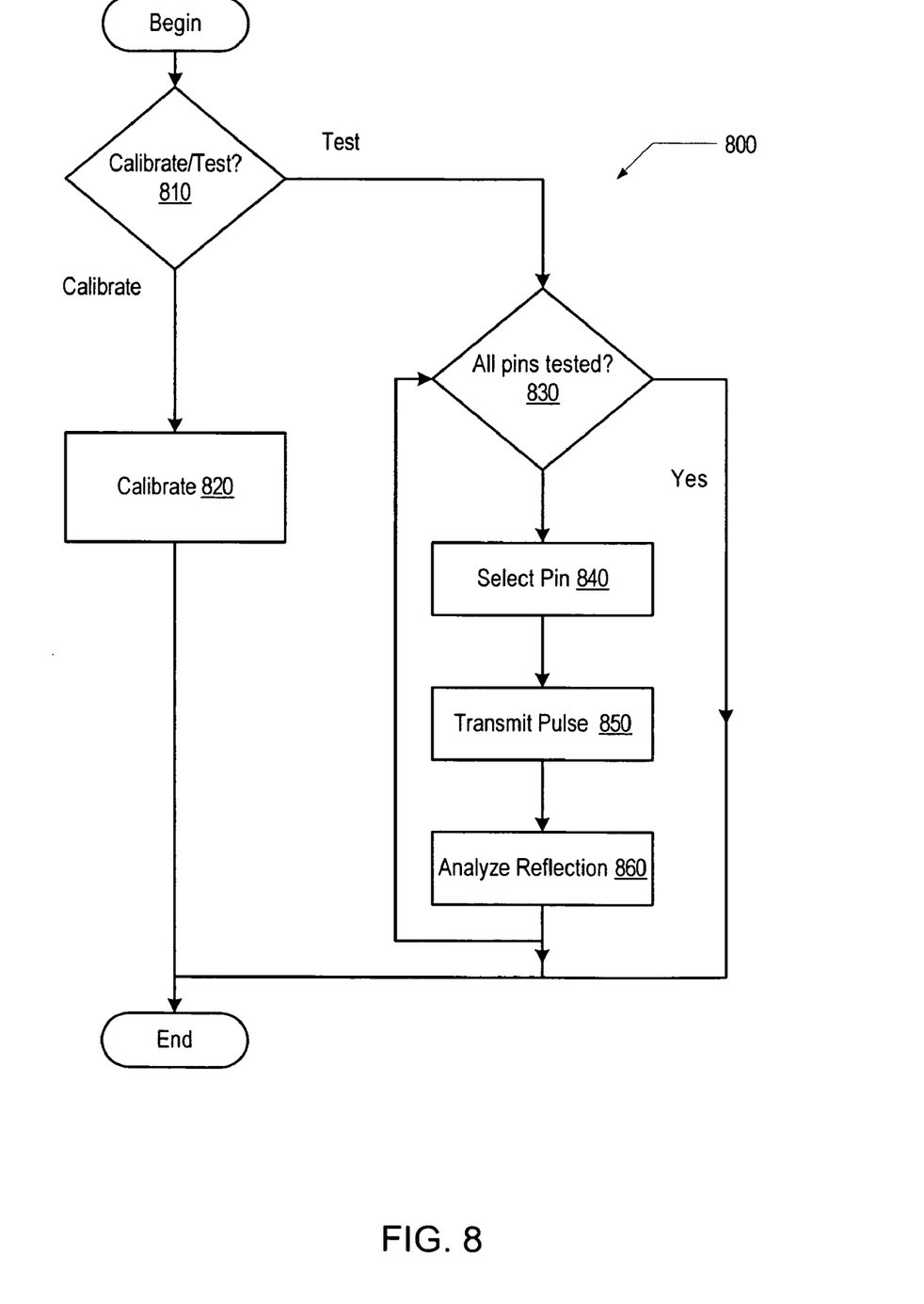
FIG. 8 is a generalized flow chart of the processes of one embodiment of a TDR test.

FIG. 8 illustrates one embodiment of a method 800 for performing TDR calibration and testing. Initially, a determination is made as to whether a user desires to perform a calibration or a test of a packaged device (decision block 810). If the user has selected calibration, a calibration of the system is performed (block 820). A detailed description of a calibration process is given below. Alternatively, if a user has selected a test of a packaged device, a loop comprising decision block 830 and blocks 840, 850, and 860 may be performed. In one embodiment, the loop may be executed once for each pin of a packaged device. For each iteration of the loop, one of the pins is selected for testing (block 840) and a pulse is transmitted through the signal path that includes the selected pin (block 850). Subsequent to transmission of the pulse, a sampling circuit may capture and analyze reflected signals to determine the timing of the reflected signals as compared to that of a calibration dataset (block 860). Upon completion of the analysis, it may be determined if there are additional pins to be tested (decision block 830). If all of the desired pins have been tested, the process 800 is complete. If there are additional pins to be tested, another iteration of the loop may be performed.

Figure 9:
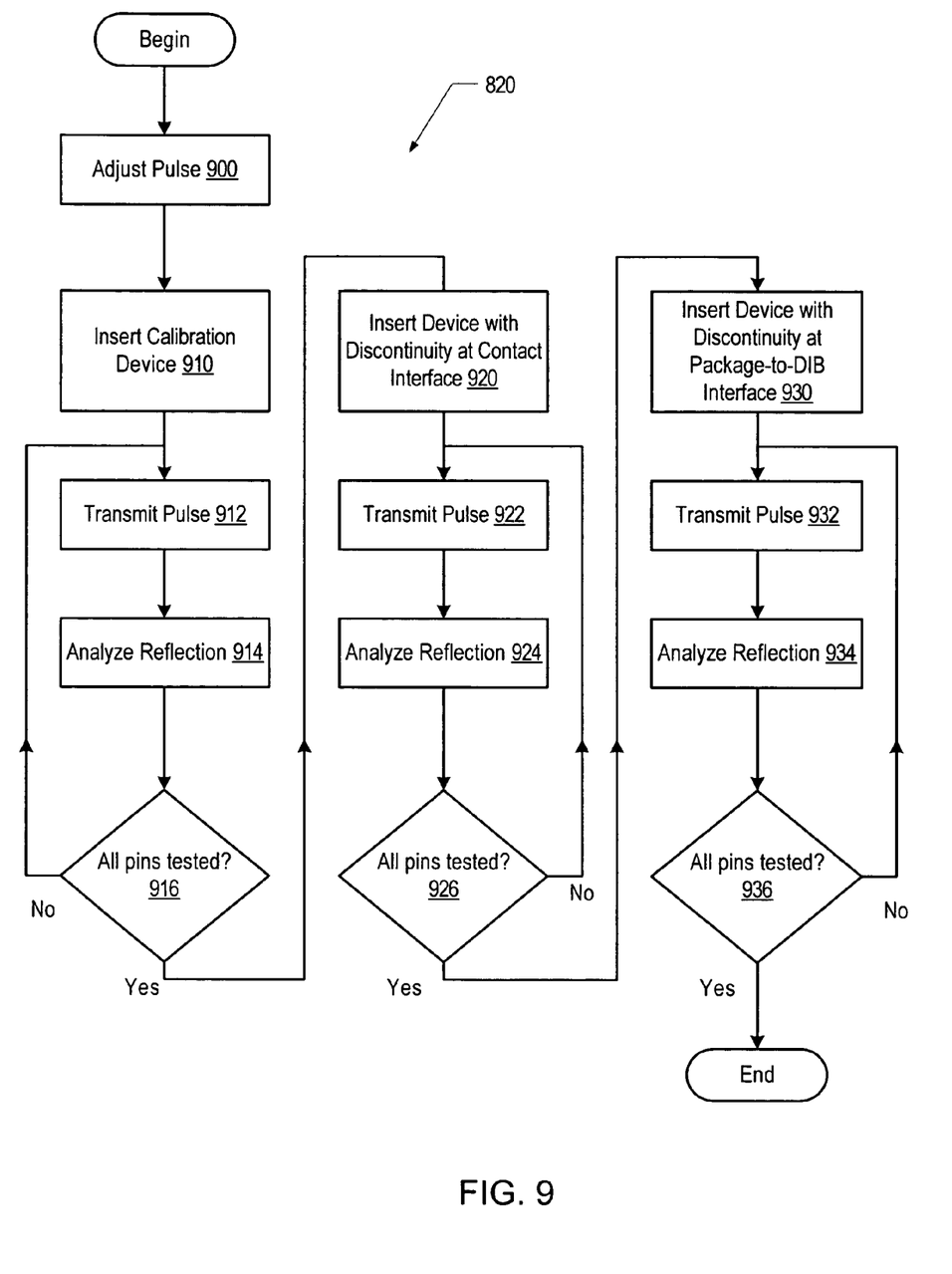
FIG. 9 is a flow chart of one embodiment of a calibration process of a TDR test.

FIG. 9 is a flow chart illustrating one embodiment of a calibration process (e.g., calibration process 820 of FIG. 8) of a TDR test. To begin the calibration process 820, the current level and/or duration of the pulse output from pulse generator 300 within test unit 220 may be adjusted to achieve an energy level that is compatible with the desired signal path through the packaged device under test (block 900). In some embodiments, test unit 220 may be configured to transmit a high-energy pulse for testing discontinuities within electrical devices that may carry large currents safely, such as a cable harness. In that case, in order to safely test a typical packaged device, the energy level of the pulse may be reduced.

Once the pulse output level has been set, the user may insert a first calibration packaged device containing no discontinuities (i.e., a known "good" device) into DIB 420 (block 910). After the calibration packaged device is inserted, pulse generator 300 may transmit a pulse to a selected signal path (block 912). Reflected pulses may be analyzed in block 914 which may include:

a) causing sampling circuit 310 to capture a calibration dataset, and b) analyzing the calibration dataset to determine the timing of a reflected signal.

Upon completion of the analysis, the user may be asked to specify if there are additional signal paths to be tested (decision block 916). If so, another iteration of pulse transmission and analysis may be started at block 912.

Once all of the desired signal paths in the first calibration packaged device have been tested, the user may be prompted to insert a second calibration packaged device containing discontinuities at a known location such as the contact interface 410 (block 920). After the calibration packaged device is inserted, pulse generator 300 may transmit a pulse to a selected signal path (block 922). Reflected pulses may be analyzed in block 924 which may include a) causing sampling circuit 310 to capture a calibration dataset, and b) analyzing the calibration dataset to determine the timing of a reflected signal.

Upon completion of the analysis, the user may be asked to specify if there are additional signal paths to be tested (decision block 926). If so, another iteration of pulse transmission and analysis may be started at block 922.

Once all of the desired signal paths in the second calibration packaged device have been tested, the user may be prompted to insert a third calibration packaged device containing discontinuities at a known location such as the package-to-DIB interface 440 (block 930). After the calibration packaged device is inserted, pulse generator 300 may transmit a pulse to a selected signal path (block 932). Reflected pulses may be analyzed in block 934 which may include a) causing sampling circuit 310 to capture a calibration dataset, and b) analyzing the calibration dataset to determine the timing of a reflected signal.

Upon completion of the analysis, the user may be asked to specify if there are additional signal paths to be tested (decision block 936). If so, another iteration of pulse transmission and analysis may be started at block 932.

Once all signal paths have been tested and the desired calibration datasets have been obtained, process 820 is complete. Of course, further devices with discontinuities at known locations may be used to obtain additional calibration data if desired. It is noted that in one embodiment, a number of captured calibration datasets may be combined into a single calibration dataset. It is further noted that while process 820 is shown to measure three calibration packaged devices, in various embodiments fewer or more calibration packaged devices with discontinuities in other locations may be measured. For example discontinuities may be introduced into known locations within the body of die 110, into the circuit traces within package 120, etc.

A wide variety of alternative embodiments of software programs executed by computer 230 are anticipated. For example, in one embodiment, software programs may be written to accommodate testing of multiple packaged devices at the same time. In a further embodiment, software programs may be written to accommodate testing of multiple signal paths of a packaged device at the same time. In still further embodiments, software programs may be written to accommodate testing of each signal path with multiple pulses, either by averaging datasets from a set of identical pulses, or otherwise analyzing multiple datasets associated with pulses of the same current and duration or different currents and/or durations. The capabilities embodied in software programs that may be executed by computer 230 depends on the type of packaged device under test and the configuration of the test system. The inherent adaptability of software programs provides for a flexible test system for making TDR measurements on a wide variety of packaged devices. In various embodiments, particular functionality may also be provided by hardware, software, or any suitable combination.

It is noted that the above described embodiments may comprise software. In such an embodiment, the program instructions which implement the methods and/or mechanisms may be conveyed or stored on a computer accessible medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Still other forms of media configured to convey program instructions for access by a computing device include terrestrial and non-terrestrial communication links such as network, wireless, and satellite links on which electrical, electromagnetic, optical, or digital signals may be conveyed. Thus, various embodiments may further include receiving, sending or storing instructions and/or data implemented in accordance with the foregoing description upon a computer accessible medium.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A test system comprising:

a test unit;

a test fixture coupled to the test unit; and a packaged device coupled to the test fixture through a plurality of electrical pins;

wherein the test unit is configured to:

transmit a pulse to at least one of the plurality of electrical pins through the test fixture;

receive a reflected signal from the packaged device through the test fixture in response to the transmitted pulse; and analyze the reflected signal to detect a discontinuity in the packaged device;

wherein the test system is configured to store a calibration dataset comprising a set of sample values corresponding to a time domain reflectometry (TDR) test of a calibration packaged device; and wherein analyzing the reflected signal comprises comparing data corresponding to the reflected signal to stored values of the calibration dataset.

2. The test system as recited in claim 1, wherein the test fixture includes a device interface board having a plurality of sockets; and wherein each of the plurality of sockets is coupled to a respective one of the plurality of electrical pins.

3. The test system as recited in claim 2, wherein the test unit comprises a pulse generator and a sampling circuit, and wherein the pulse generator and the sampling circuit are coupled to the test fixture through a selector; and wherein the selector is configured to couple the pulse generator and the sampling circuit to a selected one of the plurality of sockets in response to a command from a processor.

4. The test system as recited in claim 1, wherein the packaged device comprises:

a semiconductor die having a first plurality of electrical contacts; and a package for holding the semiconductor die having a second plurality of electrical contacts;

wherein each of the first plurality of electrical contacts is coupled to a respective one of the second plurality of electrical contacts.

5. The test system as recited in claim 1, wherein the calibration packaged device is selected from the group consisting of: a packaged device which contains no discontinuities; and a packaged device which contains a known discontinuity at a known location.

6. The test system as recited in claim 5, wherein the known location is inside the semiconductor die, the known location is at a coupling between one or more of the first plurality of electrical contacts and the second plurality of electrical contacts, or the known location is at a coupling between one or more of the plurality of electrical pins and the test fixture.

7. A method for testing a packaged device, the method comprising:

transmitting a pulse from a test unit to at least one of a plurality of electrical pins of a packaged device, the packaged device being coupled to a test fixture through the plurality of pins, and the test fixture being coupled to the test unit;

receiving a reflected signal from the packaged device through the test fixture in response to the transmitted pulse;

storing a calibration dataset comprising a set of sample values corresponding to a time domain reflectometry (TDR) test of a calibration packaged device;

analyzing the reflected signal to detect a discontinuity in the packaged device, wherein analyzing the reflected signal includes comparing data corresponding to the reflected signal to stored values of the calibration dataset; and providing an indication corresponding to said detected discontinuity.

8. The method of claim 7, wherein the test fixture includes a device interface board having a plurality of sockets, each of the plurality of sockets being coupled to a respective one of the plurality of electrical pins.

9. The method of claim 8, wherein the test unit comprises a pulse generator and a sampling circuit coupled to the test fixture through a selector, wherein the method further comprises:

transmitting a command to the selector to connect the pulse generator and the sampling circuit to a selected one of the plurality of electrical pins;

transmitting a first pulse to the selected one of the plurality of electrical pins; and analyzing a reflected signal received from the sampling circuit in response to the transmitted first pulse.

10. The method of claim 7, wherein the packaged device comprises:

a semiconductor die having a first plurality of electrical contacts; and a package for holding the semiconductor die having a second plurality of electrical contacts;

wherein each of the first plurality of electrical contacts is coupled to a respective one of the second plurality of electrical contacts.

11. The method of claim 7, wherein the calibration packaged device is selected from the group consisting of: a packaged device which contains no discontinuities; and a packaged device which contains a known discontinuity at a known location.

12. The method of claim 11, wherein the known location is inside the semiconductor die, the known location is at a coupling between one or more of the first plurality of electrical contacts and the second plurality of electrical contacts, or the known location is at a coupling between one or more of the plurality of electrical pins and the test fixture.

13. A computer accessible medium comprising program instructions, wherein said program instructions are executable to:

transmit a pulse from a test unit to at least one of a plurality of electrical pins of a packaged device, the packaged device being coupled to a test fixture through the plurality of pins, and the test fixture being coupled to the test unit;

receive a reflected signal from the packaged device through the test fixture in response to the transmitted pulse;

store a calibration dataset comprising a set of sample values corresponding to a time domain reflectometry (TDR) test of a calibration packaged device;

analyze the reflected signal to detect a discontinuity in the packaged device, wherein analyzing the reflected signal includes comparing data corresponding to the reflected signal to stored values of the calibration dataset; and provide an indication corresponding to said detected discontinuity.

14. The computer accessible medium of claim 13, wherein the calibration packaged device is selected from the group consisting of: a packaged device which contains no discontinuities; and a packaged device which contains a known discontinuity at a known location.

15. A test system comprising:

a test unit;

a test fixture coupled to the test unit; and a packaged device coupled to the test fixture through a plurality of electrical pins;

wherein the test unit is configured to:

transmit a pulse to at least one of the plurality of electrical pins through the test fixture;

receive a reflected signal from the packaged device through the test fixture in response to the transmitted pulse; and analyze the reflected signal to detect a discontinuity in the packaged device;

wherein the test fixture includes a device interface board having a plurality of sockets; and wherein each of the plurality of sockets is coupled to a respective one of the plurality of electrical pins;

wherein the test unit comprises a pulse generator and a sampling circuit, and wherein the pulse generator and the sampling circuit are coupled to the test fixture through a selector; and wherein the selector is configured to couple the pulse generator and the sampling circuit to a selected one of the plurality of sockets in response to a command from a processor.

* * * * *